(12) United States Patent
Michalica et al.

(10) Patent No.: US 11,820,079 B2
(45) Date of Patent: Nov. 21, 2023

(54) STEREOLITHOGRAPHY APPARATUS HAVING A DETECTION UNIT FOR OPTICAL ADJUSTMENT AND IMAGE MODIFICATION

(71) Applicants: DENTSPLY SIRONA inc., York, PA (US); SIRONA DENTAL SYSTEMS GMBH, Bensheim (DE)

(72) Inventors: Thomas Michalica, Neudorf (AT); Christian Schmidt, Bensheim (DE); Franz Basler, Laudenbach (DE)

(73) Assignee: DENTSPLY SIRONA INC., York, PA (US)

( * ) Notice: Subject to any disclaimer, the term of this patent is extended or adjusted under 35 U.S.C. 154(b) by 130 days.

(21) Appl. No.: 17/433,356

(22) PCT Filed: Mar. 11, 2020

(86) PCT No.: PCT/EP2020/056495
§ 371 (c)(1),
(2) Date: Aug. 24, 2021

(87) PCT Pub. No.: WO2020/182878
PCT Pub. Date: Sep. 17, 2020

(65) Prior Publication Data
US 2022/0048256 A1     Feb. 17, 2022

(30) Foreign Application Priority Data

Mar. 11, 2019   (EP) .................................... 19020118

(51) Int. Cl.
*B29C 64/393*      (2017.01)
*B33Y 30/00*       (2015.01)
(Continued)

(52) U.S. Cl.
CPC .......... *B29C 64/393* (2017.08); *B29C 64/129* (2017.08); *B29C 64/232* (2017.08);
(Continued)

(58) Field of Classification Search
CPC ... B29C 64/393; B29C 64/232; B29C 64/236; B29C 64/241; B29C 64/129; B33Y 30/00; B33Y 50/02
(Continued)

(56) References Cited

U.S. PATENT DOCUMENTS

2009/0184444 A1* 7/2009 Honda ................... B33Y 30/00
                                                                         264/401

FOREIGN PATENT DOCUMENTS

EP            1106332 A2 *  6/2001   ........... B29C 64/124

OTHER PUBLICATIONS

EP19020118.6, European Search Report (Year: 2019).*
(Continued)

*Primary Examiner* — Nahida Sultana
*Assistant Examiner* — Lawrence D. Hohenbrink, Jr.
(74) *Attorney, Agent, or Firm* — DENTSPLY SIRONA INC.

(57) ABSTRACT

The present invention relates to a stereolithography apparatus for generating a three-dimensional object, comprising: an optical unit for projecting an image towards the photocurable substance for hardening the photocurable substance deposited in the focus layer; a control unit, characterized by further comprising: a detection unit which comprises: a detection means movably arranged in a detection region for detecting during the generation process or in a generation-pause the image projected by the optical unit and for outputting a detection signal; and a first driving means for moving the detection means into or out of the detection region, wherein the optical unit comprises: a second driving
(Continued)

means linked to the optical unit for moving the focus layer into or out of the detection region, wherein the control unit adjusts the optical unit and/or modifies the image to be projected based on the signal indicative of the detected image.

15 Claims, 9 Drawing Sheets

(51) Int. Cl.
  *B33Y 50/02* (2015.01)
  *B29C 64/232* (2017.01)
  *B29C 64/236* (2017.01)
  *B29C 64/241* (2017.01)
  *B29C 64/129* (2017.01)
(52) U.S. Cl.
  CPC .......... *B29C 64/236* (2017.08); *B29C 64/241* (2017.08); *B33Y 30/00* (2014.12); *B33Y 50/02* (2014.12)
(58) Field of Classification Search
  USPC .......................................................... 425/135
  See application file for complete search history.

(56) References Cited

OTHER PUBLICATIONS

EP19020118.6, European Search Opinion (Year: 2019).*
EP19020118.6, Applicant Response to the extended European search report (Year: 2021).*

* cited by examiner

STEREOLITHOGRAPHY APPARATUS HAVING A DETECTION UNIT FOR OPTICAL ADJUSTMENT AND IMAGE MODIFICATION

CROSS-REFERENCE TO RELATED APPLICATIONS

This is a National Phase application of International Application No. PCT/EP2020/056495, tiled Mar. 11, 2020, which claims the benefit of and priority to German Application Ser. No. 19020118.6, filed on Mar. 11, 2019, which are herein incorporated by reference for all purposes.

TECHNICAL FIELD OF THE INVENTION

The present invention relates to stereolithography apparatuses. The present invention more particularly relates to calibration techniques for stereolithography apparatuses.

BACKGROUND ART OF THE INVENTION

A stereolithography apparatus is used for the manufacturing process of a three-dimensional object with a desired shape through exposing, either stepwise or continuously, a photocurable substance e.g., a liquid monomer, with layered images that can be generated, for example by digital masks or by scans of a laser beam. The basic principle of stereolithography is also commonly called rapid prototyping or 3D printing. For the stereolithographic manufacturing process, apart from a pixel-based display that creates digital masks, alternatively a laser beam in conjunction with controllable micromirrors can also be used to project layered images, particularly pixel-based layered images, into a reference surface in the photocurable substance to harden it stepwise or continuously. This reference surface is defined through the focal layer in which the curing of the photocurable substance occurs. Depending on the application, the cured layer can have a rigid or flexible consistency and can also be located within the volume of the fluid photocurable substance. To separate the cured layer from the reference surface, prior to the next step of the generation process, it is initially transferred through adhesion in a polymerization process to a platform which is relatively movable with respect to the reference surface. In the next steps of the generation process, it is ensured that fresh photocurable substance flows between the last cured layer i.e., the polymerization front, and the reference surface. This can be achieved for example by a simple relative movement of the platform or combinations of strokes. Then the inflowing photocurable substance can be cured by the subsequent exposure. The steps of the generation process are repeated until the object has been generated in accordance with the projected layered images.

The optical unit plays an important role in the manufacturing process of three-dimensional objects. The optical unit projects the layered images in the form of electromagnetic radiation into the photocurable substance. To ensure stable and accurate object dimensions over the entire life cycle of the stereolithography apparatus, it is important that the actual state of the optical unit i.e., the light source, the projection means, the digital mirror devices and the like, remain as initially calibrated and at the installed positions. Thus, in the stereolithographic manufacturing process, a problem arises when the properties of the optical unit, for instance, the magnification scale changes. This has the consequence that the 3D objects of a batch may have errors which are only observed by the user after a certain time has elapsed e.g., through a change of the object size. In the prior art, the stability of the magnification scale and the associated correctness in the size of the object is from time to time controlled by the user through generating calibration bodies and by measuring them. These calibration bodies must be usually kept by the user and delivered with the batch. Dices or staircase-like objects which have a variety of measuring surfaces are used for this purpose as calibration objects. In the prior art, the properties of the optical unit, e.g., the position of the focus layer of a stereolithography apparatus is calibrated in the factory and can be later calibrated only through an intervention in the stereolithography apparatus by a service technician. Some calibration techniques for stereolithography apparatuses are also known from the prior art.

EP1726927A1 discloses a projection apparatus in which a sensor that detects non-imaging light is used for calibrating the projected image.

US2003/0179435A1 discloses a projector apparatus in which a sensor that detects diverted light is used for calibrating the light source.

EP1849587A1 discloses a stereolithography apparatus which uses a constant grey scale compensation matrix that is superposed on every single bitmap mask for achieving homogeneous distribution of light.

WO 2016016443A1 discloses a stereolithography apparatus having a light homogenizer for improving the light intensity.

US 2009/0184444A1 discloses an optical molding apparatus that detects feedback light reflected by the ultraviolet curable resin.

EP1106332 A2 discloses a stereolithography apparatus and stereolithographic beam profiling using a pinhole calibration plate which is positioned in the precise location of the surface of the UV curable liquid prior to shipping or after damage of the stereolithography apparatus.

SUMMARY OF THE INVENTION

An objective of the present invention is to overcome the disadvantages of the prior art and provide a stereolithography apparatus which can perform optical adjustment and image modification selectively during a generation process or in a generation pause in a versatile, extensive and flexible way.

The present invention provides a stereolithography apparatus for generating a three-dimensional object from a photocurable substance. The stereolithography apparatus comprises: an optical unit for projecting an image towards the photocurable substance for hardening the photocurable substance deposited in the focus layer; and a control unit for controlling the optical unit. The stereolithography apparatus further comprises: a detection unit which comprises: a detection means that is movably arranged in a detection region for detecting during the generation process or in a generation-pause at least part of the image projected by the optical unit and for outputting a signal indicative of the detected image to the control unit; and a first driving means for moving the detection means into or out of the detection region, wherein the optical unit further comprises: a second driving means which is linked to the optical unit for moving the focus layer into or out of the detection region, and wherein the control unit is further adapted to control the first driving unit and the second driving means, and to selectively adjust the optical unit and/or to modify the image to be projected based on the signal indicative of the detected image.

A major advantageous effect of the present invention is that the physical properties of the optical unit for instance a change in the position of the optical unit or its components, a change in the focus layer, a change in the image sharpness, a change in the magnification scale, a change in the intensity distribution, a change in the homogeneity of the illumination, the optical distortion, any pixel errors and the like that adversely affect the manufacturing process of the 3D objects can be detected during the generation process or in a generation-pause, selectively through the built-in detection unit at different projection depths and image sizes and removed immediately either through an optical adjustment and/or an image modification. Thereby the need for the 3D printing of calibration objects and measuring these calibration objects during a manufacturing process can be omitted, and thus the calibration process becomes less complex and mainly digital.

According to the present invention, the detection region may be disposed above the optical unit and underside of the vat which stores the photocurable substance to attain a space-saving, compact tower-like structure. The detection region may be alternatively disposed above the optical unit and above the vat which stores the photocurable substance. The vat may be removable, and the detection region may be disposed into the space from which the vat has been removed. The first driving means moves the detection means into or out of the detection region along a direction which is perpendicular to the optical axis. This direction may be parallel to either one of the sides of the rectangular vat storing the photocurable substance. Thereby, the detection means can be moved relative to the optical axis within the projection layer, or a focal layer inside the detection region. The second driving means moves the focal layer into or out of the detection region along the optical axis. The focal layer can be moved in or out of the detection region by either moving the entire optical unit or its optical components such as the imaging lens. Both the first and second driving means have mechanical arrangements including motors and associated actuators for operating the motors.

According to the present invention, the detection unit may be either stationary or preferably removably built into the stereolithography apparatus. The detection unit may be arranged onto a movable and functional part such as the vat which stores the photocurable substance. Alternatively, an additional transparent drawer may be used. The drawer may be exchanged with the vat, or received below or above the vat. The mechanical parts which guide the detection means during a scanning process may be disposed on the movable vat/drawer and/or the body of the stereolithography apparatus. Thus, the detection unit may be pulled out of the stereolithography apparatus together with the movable vat or the drawer. The detection unit may use the same mechanical and electrical interfaces used for the attachment, the data communication, and the control of a functional component of the removable vat. Such a functional component might be the rotational/translational wiper used for wiping the photocurable substance.

According to the present invention, the detection means comprises one or more sensors, preferably one or more sensor arrays or line sensors. The sensors may be combined into one or more groups of sensors. One or more sensor arrays may be arranged on an arm which is linked to the first driving means to be moved into or out of the detection region. The arm may be arranged below the vat, parallel to the surface of the photocurable substance that is facing the optical unit. The arm may have a length equal to or shorter than the width of the vat. One or more sensors may be light sensitive diodes or have an active sensor area such as in a CCD camera or a CMOS camera. One or more sensors may have an optical element such as a lens, filter, aperture, reflector on the active sensor area. One or more sensors may be used to detect the optical character of the light sources of the optical unit, i.e., at least part of the wavelength spectrum relating to the ambient radiation or temperature, and at least part of the wavelength spectrum that is required for the photocuring process. Thereby, the aging of the light source, the actual light output of the light source within the allowed tolerance, and an increase in the room temperature can be detected and accordingly compensated. One or more sensors may be used to detect the energy density in the volume of a voxel by changing the focal position in the depth of field during the detection. The gray levels in the layer images to be exposed may be optimized for the curing process of the photocurable substance based on the light source temperature, light source power, and the radiative energy introduced into the photocurable substance and the like.

According to the present invention, the control unit adjusts the optical unit to remove a tilting of the optical axis by controlling the second driving means. The second driving means can independently rotate the optical unit about three mutually perpendicular directions wherein one of these directions is perpendicular to the surface of the photocurable substance facing the optical unit. The optical unit may be suspended from or supported by a universal joint. The tilt in the focus layer may be detected, for example, by using a calibration image to be projected towards the focus layer. The rows of alternating pixels in the calibration image which are aligned between the opposing ends of the focal layer allow detection of the change in the intensity and sharpness which are indicative of a tilt about the respective direction. The calibration image may be projected in the generation pause. Alternatively, the calibration image maybe projected during the generation process on a region which need not to be actively exposed for the generation of the 3D Object. In either case the calibration image may be projected only on one or more active sensor areas to prevent curing of the photocurable substance. Thereby the continuous monitoring of the optical features of the optical unit through the detection unit becomes possible.

According to the present invention, the detection means may also detect stray radiation resulting from the image projected by the optical unit into an actively exposed region for the object generation. During the detection of the stray radiation, the first driving means may move the detection means out of the region that is actively exposed by the optical unit but not out of the detection region. Thus, it is possible to detect the stray radiation within the detection region during the generation process, for example at a certain position wherein at least one sensor is placed through the first driving means so that it does not disturb the generation process. Thereby the radiation dose of the photocurable substance caused by the stray radiation can be detected and compared with the permissible dose. Depending on the level of the stray radiation dose, the photocurable substance can be circulated and/or refreshed through the addition of new photocurable substance. Also at least one sensor for detecting stray radiation may be permanently arranged into the detection region such that it is an integral part of the machine room, which is not necessarily accessible to the user.

According to the present invention, the optical unit may project towards the photocurable substance a relatively small image that will be entirely obstructed by the detection means to prevent hardening of the photocurable substance during the detection. Then, the detection means detects at least part of this small images, and the control unit adjusts the optical unit or modifies the image to be projected for the generation process based on the detection. These small images can be projected onto the sensors in a generation pause, for instance, in between the exposure of two successive layer images. Alternatively, the small images can be projected onto the sensors that are moved to a location in the detection region which needs not to be actively exposed through the optical unit with the layer image and thus the continuous monitoring of the optical features of the optical unit through the detection unit may also take place during the generation process. Thereby continuous monitoring is possible without causing excessive radiation.

According to the present invention, the detection means may detect at least part of the image projected by the optical unit when the first driving means stepwise or continually moves the detection means along a direction perpendicular to the optical axis within the detection region. During this scanning process, the detection means may output to the control unit a signal indicative of the scanned image. Then, the control unit may determine a compensation matrix based on the detected image and modify the image to be projected based on the compensation matrix. Thereby the optical distortion can be compensated.

According to the present invention, the control unit may adjust the magnification scale, sharpness of the layer image, position of the focus layer, and compensate for the optical distortion of the optical unit based on the detected image. However, when a detection is not possible, a conclusion can be outputted that there is a fault in the optical unit, for instance, in the light source. The first/second driving means may perform a scanning process to locate the focal layer and determine its optical features. The stereolithography device may change the magnification scale, sharpness of the layer image, the position of the focal layer or the projection distance through relative movements of one or more imaging/zooming lenses in the optical unit at least in a certain range. The stereolithography apparatus may also have at least one folded beam path which permits adjustment of the focus layer position by means of a relative movement of a corresponding optical element, such as at least one mirror. Imaging errors such as optical distortions that can arise from the optical unit may be detected not only globally but also locally, per regions, for different projection sizes and can be used to modify parameters governing the operation of the stereolithography apparatus or to modify the layer images through establishing a compensation matrix for compensating the optical distortions.

According to the present invention, the optical unit may comprise two or more sub optical units for independently projecting two or more images towards the photocurable substance for hardening the photocurable substance deposited in the focus layers respectively. The detection means may detect during the generation process or in a generation pause at least part of each of these two or more images and output a signal indicative of the detected images to the control unit. The second driving means may comprise two second sub driving means each linked to the sub optical units for moving the focus layers into or out of the detection region. The second sub driving means may be mutually coupled to drive the focus layers into or out of the detection region simultaneously. The control unit may adjust the sub optical units and/or modify the images to be projected based on the signal indicative of the detected images and obtain the same imaging properties in the focus layers such as homogeneity, pixel size and the like. Thereby, the optical features of the individual exposures can be matched. The calibration image may include a mask with bright and dark pixels which define at least one or two measuring points and/or regions whose local distances and sizes are pre-known and used for calibrating the optical unit or the sub-optical units and modifying the layered images.

According to the present invention, the control unit may cause the second driving unit to adjust the two or more sub optical units based on the signal output by the detection means to generate the respective images in the focal layers side-by-side without gaps, jumps and overlaps. Thereby, the spacing between the individual exposures can be eliminated and the transition can be smoothed.

According to the present invention, the control unit may cause the vat to be tilted or translated back and forth relative to the platform holding the 3D object. Thereby, the detachment process of the cured layers can be expedited, and the generation process can be accelerated.

According to the present invention, the stereolithography apparatus performs the calibration without the need of any active measurement by the user. Thereby the characteristic features of the optical unit, for instance, the light source can be kept stable or in a predefined specific range. In addition, a preventive calibration routine may be performed prior to each generation process and/or after a certain number of completed generation processes, automatically or upon a user request. The stereolithography apparatus may also store a detection/scanning protocol which is important for the generation process in respect of at least one important feature of the optical unit for various one or more steps in the generation process and optionally to transfer it to a peripheral device through a LAN/WLAN or the like to allow a comprehensive process protocol of the generated 3D object. These may be transferred to a CAD CAM module. The stereolithography apparatus may also permit online calibration as well as fault diagnosis and to conduct/monitor the calibration and the fault diagnosis locally or remotely.

BRIEF DESCRIPTION OF THE DRAWINGS

In the subsequent description, further aspects and advantageous effects of the present invention will be described in more detail by using exemplary embodiments and referring to the drawings, wherein FIG. 1—is a schematic view of a stereolithography apparatus according to a first embodiment of the present invention, in a state wherein the focus layer is retracted to a position coinciding with the detecting means.

DETAILED DESCRIPTION OF THE INVENTION

Figure 4:
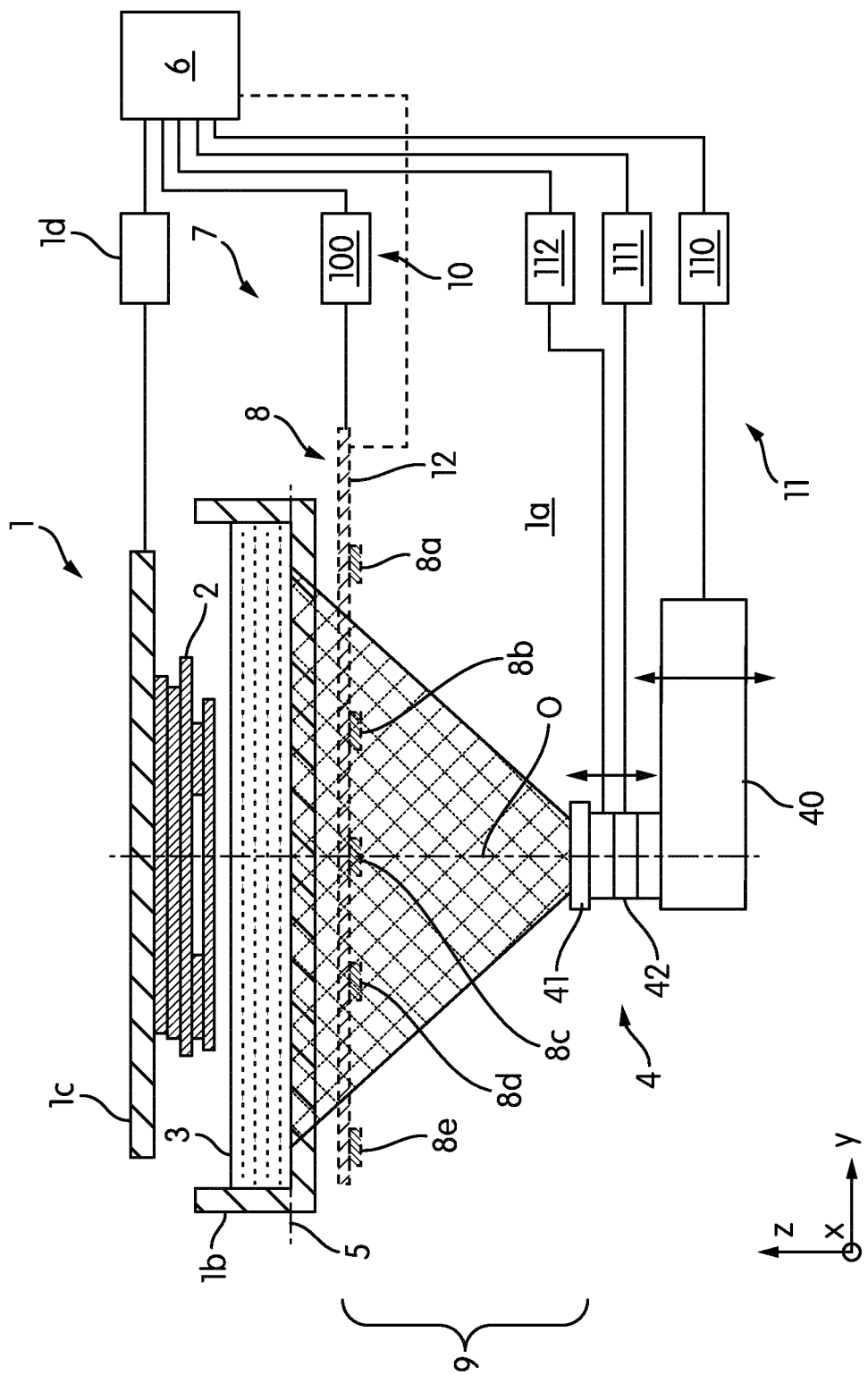
FIG. 4—is a schematic view of the stereolithography apparatus of FIG. 1, when the focus layer is on the bottom of the vat during the generation process, and the detecting means is moved out of the detection region.

The reference numbers shown in the drawings denote the elements as listed below and will be referred to in the subsequent description of the exemplary embodiments:
1. Stereolithography apparatus
   1a. Machine room
   1b. Vat
   1c. Platform
   1d. Actuator
2. Object
3. Photocurable substance
4. Optical unit
   40. Chassis
   41. Imaging lens
   42. Zooming lens
   4a. Sub optical unit
   40a. Chassis
   41a. Imaging lens
   42a Zooming lens
   4b. Sub optical unit
   40b. Chassis
   41b. Imaging Lens
   42b Zooming lens
5. Focus layer
   5a. Focus layer
   5b. Focus layer
6. Control unit
7. Detection unit
8. Detection means
   8a-8f. Sensors
   80. Active sensor area
9. Detection region
10. First driving means
    100. Actuator
11. Second driving means
    110. Actuator
    111. Actuator
    112. Actuator
    11a. Second sub driving means
    110a. Actuator
    111a. Actuator
    112a. Actuator
    11b. Second sub driving means
    110b. Actuator
    111b. Actuator
    112b. Actuator
12. Arm
13. Calibration image
    130. Left region
    131. Right region
14. Row
15. Pixel FIG. 4 shows a stereolithography apparatus (1) according to a first embodiment during the generation process of 3D object. As shown in FIG. 4 the stereolithography apparatus (1) has a machine room (1a) for the stepwise and/or continuous generation of at least a 3D object (2). The 3D object (2) is generated from a photocurable substance (3) which is stored inside a vat (1b). The photocurable substance (3) is in the fluid form and can have various consistencies, it can also be pasty, for example. The photocurable substance (3) adheres to a platform (1c) after it has been cured. The platform (1c) can be driven upwards or downwards relative to the vat (1b) at least through one motor and an actuator (1d). All the processes in the stereolithography apparatus (1) are controlled and regulated through a control unit (6). The stereolithography apparatus (1) has also an interface for wireless and/or wired communication with a CAD CAM module. The stereolithography apparatus (1) has an optical unit (4) for projecting an image towards the photocurable substance (3) for hardening the photocurable substance (3) deposited in the focus layer (5). The optical unit (4) has a light source, digital mirror devices (DMD), an imagining lens (41), a zooming lens (42), etc. The chassis (40) accommodates all necessary components for the projection of the images. The light source emits electromagnetic radiation, preferably UV radiation, having a wavelength of, for example, 365 nm or 385 nm. As shown in FIG. 4, the optical unit (4) is located under the vat (1b), which need not necessarily be the case.

Figure 1:
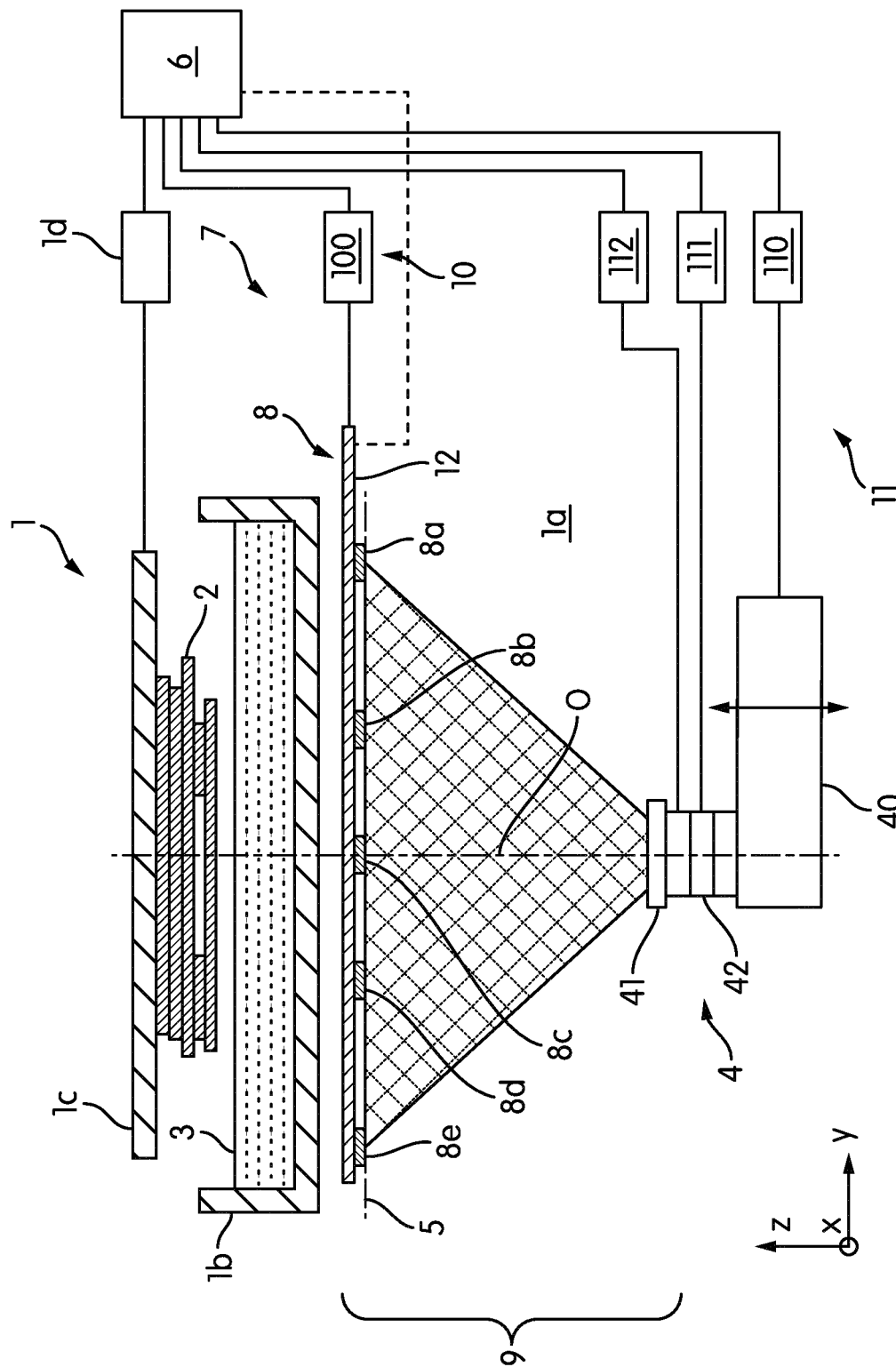
Figure 5A:
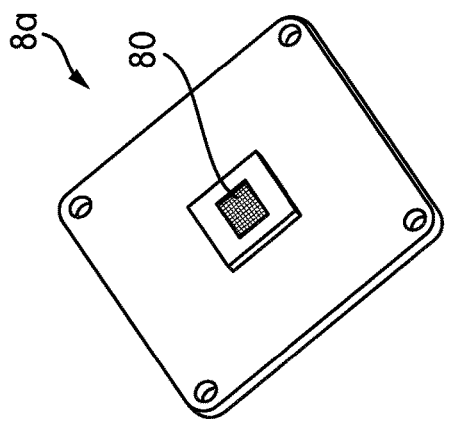
FIG. 5a—is a schematic view of a sensor used in the detection means of the stereolithography apparatus according to an embodiment of the present invention.
Figure 5B:
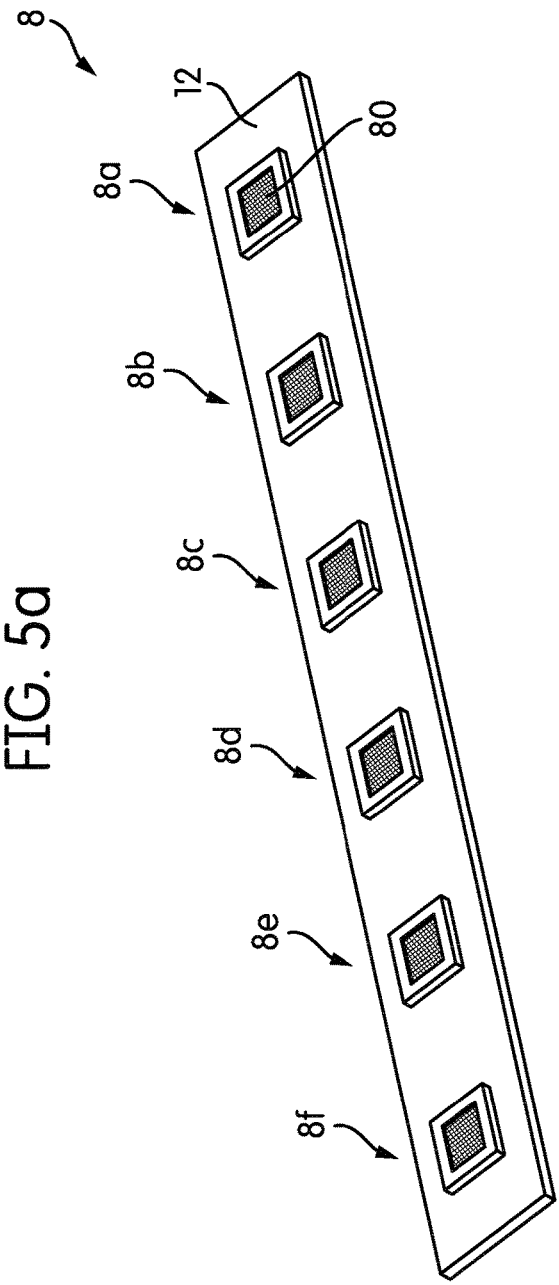
FIG. 5b—is a schematic view of an array of sensors used in the detection means of the stereolithography apparatus according to an embodiment of the present invention.

FIG. 1 shows the stereolithography apparatus (1) of the first embodiment as it performs a detection process for detecting an image projected by the optical unit (4). As shown in FIG. 1, the stereolithography apparatus (1) has a detection unit (7) which comprises a detection means (8) that is movably arranged in a detection region (9) to detect, during the generation process or in a generation-pause, at least part of the image projected by the optical unit (4) and to output a signal indicative of the detected image to the control unit (6). The detection means (8) has preferably a plurality of sensors (8a-8e). As shown in FIG. 5a, each sensor (8a-8f) preferably has an active sensor area (80) such as a CMOS camera. As shown in FIG. 1 and in FIG. 5b, the detection means (8) has an arm (12) for supporting the sensors (8a-8f) in an array. The detection unit (7) also has a first driving means (10) for moving the detection means (8) in the x-y plane. The first driving means (10) is linked to the arm (12) and can move by means of a motor and an actuator (100) the arm (12) into or out of the detection region (9) along a direction (X,Y) perpendicular to the optical axis (O). Thereby the projected image can be partly or entirely scanned, and the data can be transferred through the signal to the control unit (6). The arm (12) is arranged parallel the surface of the photocurable substance (3) that is facing the optical unit (4). The optical unit (4) has a second driving means (11) which is linked to the optical unit (4) via motors and actuators (110,111,112) for moving the focus layer (5) into or out of the detection region (9). The imaging lens (41), and the zooming lenses (42) can be driven through the motors and the associated actuators (111,112) to set the sharpness and the magnification scale. The entire optical unit (4) can be driven along the optical axis (O) through a motor and the associated actuator (110). As shown in FIG. 1, the focus layer (5) is in the ideal alignment, namely parallel to the vat (2), but retracted to the position coincident with the active sensor areas (80) of the sensors (8a-8f) such that a sharp image projected by the optical unit (4) can be detected. The image projected may be a calibration image such as a test pattern, chessboard pattern or the like which can be observed sharp in the depth of focus. The detection unit (7) can detect the magnification scale, the optical distortion, the sharpness of the projected image, and the position of the focus layer (5). The control unit (6) also controls the first driving unit (10) and the second driving means (11) and can adjust the optical unit (4) and/or modify the image to be projected based on the signal indicative of the detected image. Thereby, the magnification scale, sharpness of the layer image, and the position of the focus layer (5) of the optical unit (4) can be correctly adjusted for the generation process and the optical distortion can be compensated in the images to be projected for curing the photocurable substance (5).

Figure 9:
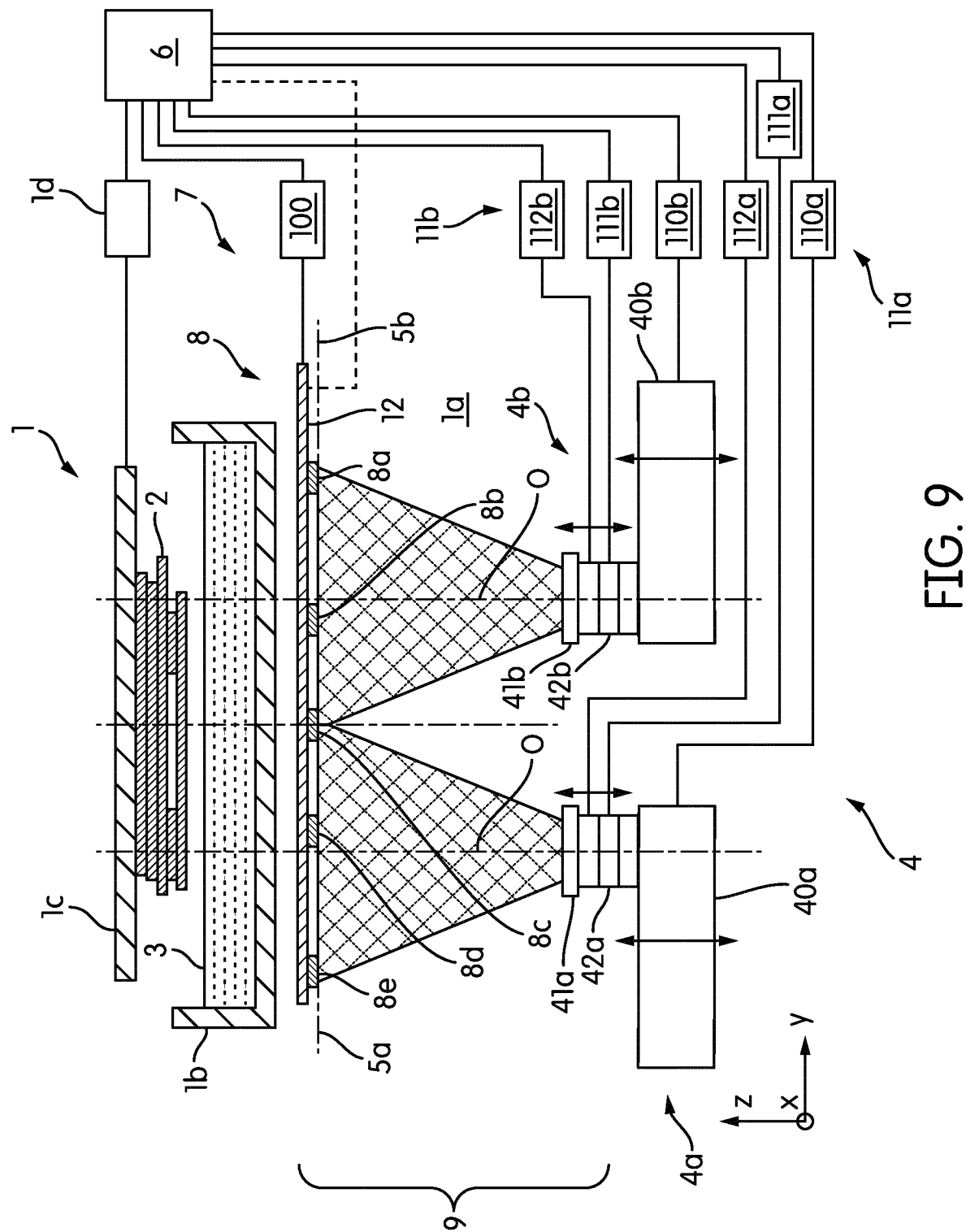
FIG. 9—is a schematic view of a stereolithography apparatus according to a second embodiment of the present invention, in which the optical unit has two independent sub optical units.

FIG. 9 shows a stereolithography apparatus (1) according to a second embodiment as it performs a detection process for detecting an image projected by the optical unit (4). As shown in FIG. 9, the optical unit (4) of the stereolithography apparatus (1) has two independent sub optical units (4a,4b). Of course, more sub optical units (4a,4b) may be built into the stereolithography apparatus (1) to obtain larger image areas. Each sub optical unit (4a,4b) has optical components such as a light source, a digital mirror device, an imaging lens (41a,41b), and a zooming lens (42a,42b) for projecting the respective image towards the photocurable substance (3) for hardening the photocurable substance (3) deposited in the respective focus layer (5a,5b). Two separate chassis (40a,40b) accommodate all necessary components respectively for the projection of the two images. The detection means (8) of the second embodiment is similar with the detection means (8) as described for the first embodiment and can detect at least partly the images projected by the sub optical units (4a,4b). The second driving means (11) has two second sub driving means (11a,11b) each linked to the sub optical units (4a,4b) respectively via motors and actuators (110a,111a,112a; 110b,111b,112b) for moving the focus layers (5a,5b) into or out of the detection region (9). The imaging lenses (41a,41b), and the zooming lenses (42a,42b) can be driven through motors and the associated actuators (111a,112a) to set the sharpness and the magnification scale. The entire optical unit (40a,40b) can be driven along the optical axis (O) through a motor and the associated actuator (110a,110b). Herein, the second sub driving means (111a, 111b), may be mutually coupled with each other to drive the focus layers (5a,5b) into or out of the detection region (9) simultaneously. This can be achieved by using a common motor. As shown in FIG. 9, the focus layers (5a,5b) are in the ideal alignment, namely parallel to the vat (2), located side-by-side without gaps, jumps and overlaps, and retracted to a position on the active sensor areas (80) of the sensors (8a-8f) such that the images projected by the sub optical units (4a,4b) can be detected sharply. The images projected may be calibration images such as test patterns, chessboard patterns or the like which allow the determination of the relative positioning of the focus layers (5a,5b) and sharpness in the depth of focus. The control unit (6) adjusts the sub optical units (4a,4b) and/or modifies the images to be projected based on the signal indicative of the detected images to obtain the same imaging properties in both focus layers (5a,5b) via the sensor technology including the motors and actuators (110a,111a,112a; 110b,111b,112b). The control unit (6) adjusts the two sub optical units (4a,4b) based on the detection result such that the respective images in the focal layers (5a,5b) are located side-by-side without jumps, gaps and overlaps.

Figure 2:
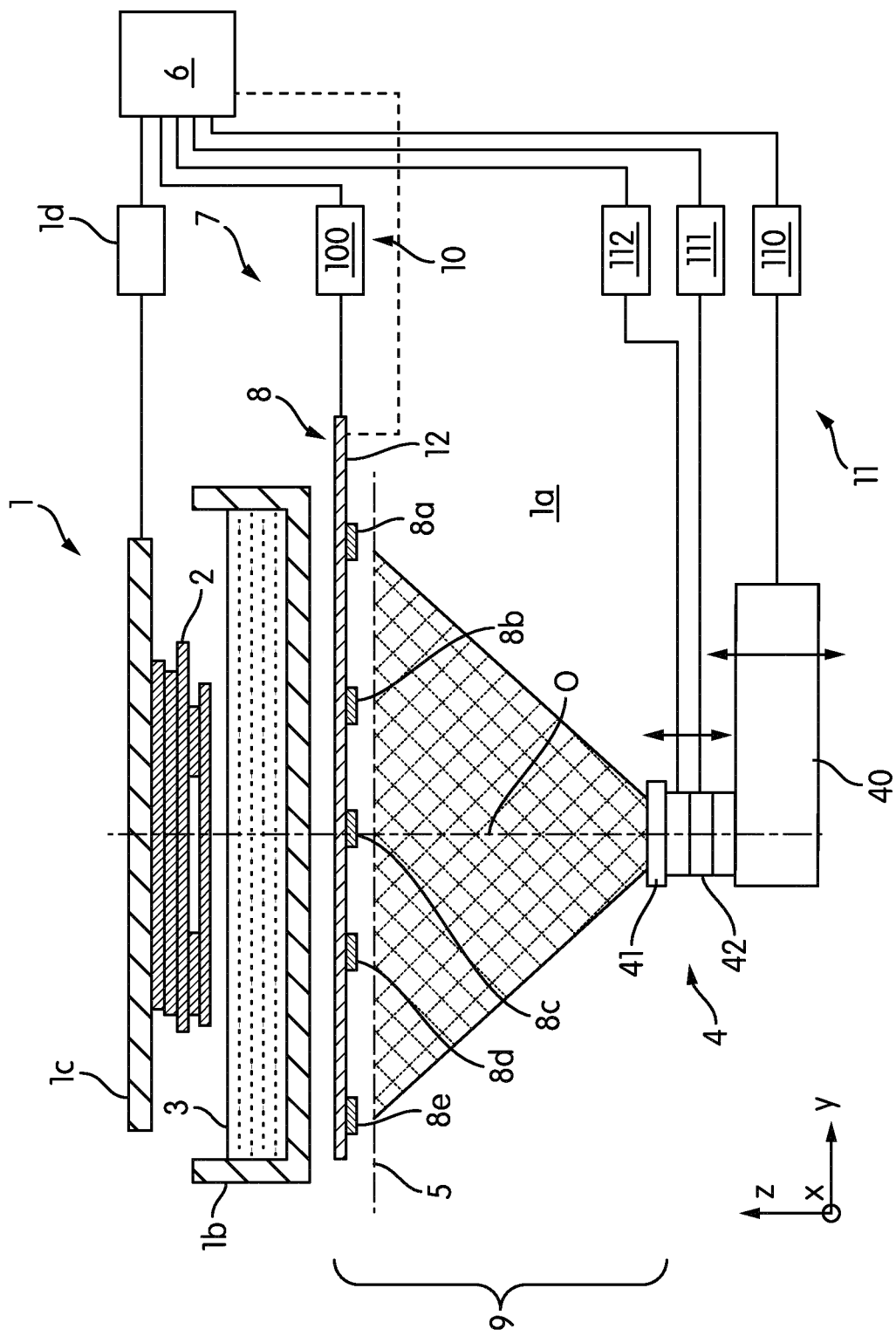
FIG. 2—is a schematic view of the stereolithography apparatus of FIG. 1, in the state when the focus layer is at a position below detecting means.

FIG. 2 shows the stereolithography apparatus (1) according to the first embodiment when the optical unit (4) has an imaging fault in which the focal layer (5) is below the vat (2). In FIG. 2, the depth of focus in which a sharp image exists lies outside, particularly below the active sensor area (80). The image detected by the detection means (8) is blurred since the active sensor area (80) does not coincide with the focus layer (5). To correct the imaging fault in FIG. 2, the control unit (6) can drive the optical unit (4) by means of the sensor technology so that the focus layer (5) is located on the detection means (8) as in FIG. 1, and subsequently the optical unit (4) can drive the focus layer (5) onto the reference area in the vat (2) for the generation process as in FIG. 4.

Figure 3:
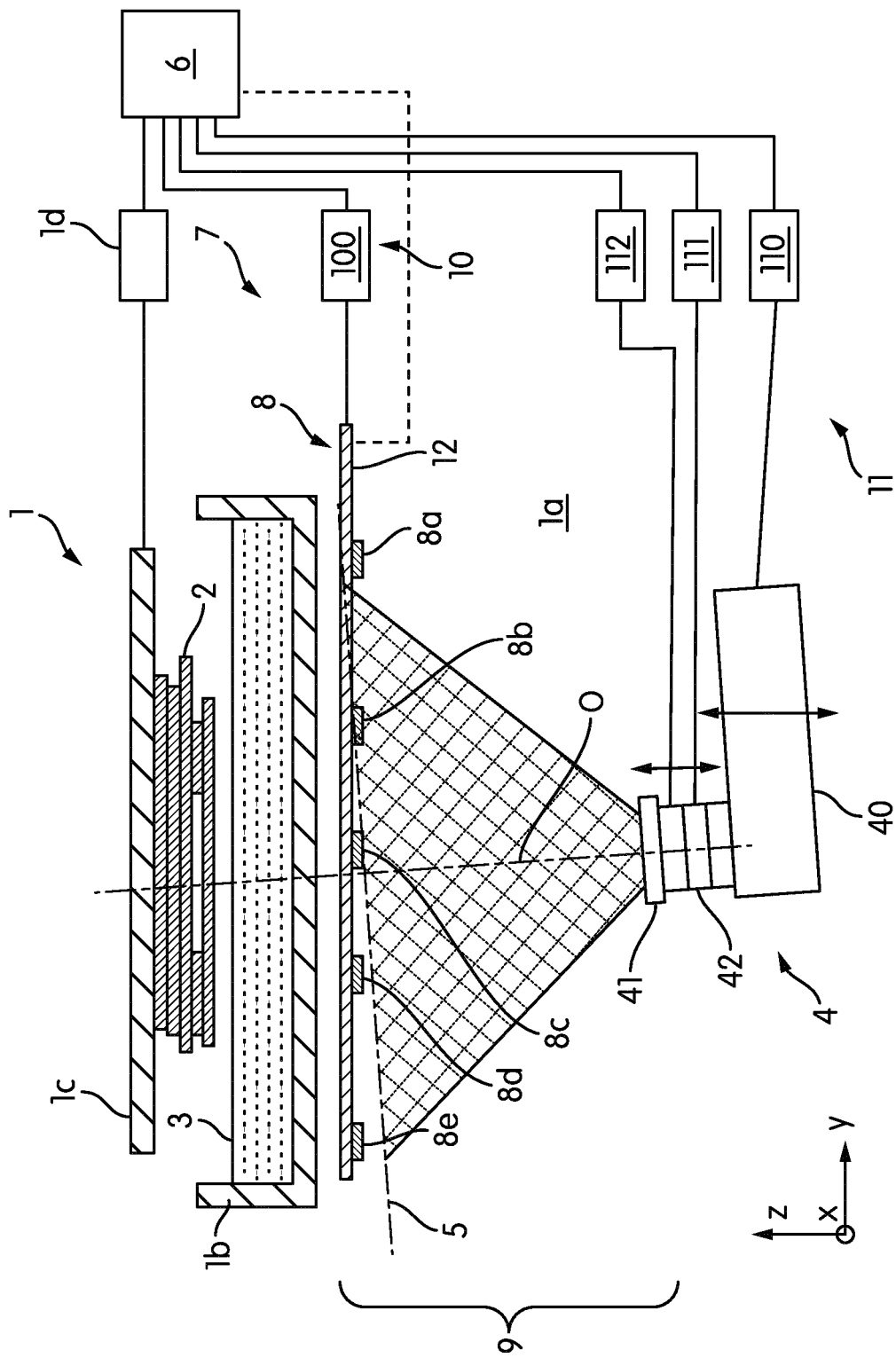
FIG. 3—is a schematic view of the stereolithography of FIG. 1, in the state when the focus layer is tilted and at a position which at least partly lies on detecting means.

FIG. 3 shows the stereolithography apparatus (1) according to the first embodiment where the optical unit (4) has an imaging fault in which the focus layer (5) is slightly tilted and located below the vat (2). As the focus layer (5) is partly coincident with the active sensor area (80) of at least one sensor (8b), this results in a region-wise sharp imaging. The other sensors (8a,8c,8d,8e) detect a blurry image. The control unit (6) causes the second driving means (11) by means of actuators to adjust the optical unit (4) to remove the tilting of the optical axis (O). The second driving means (11) can independently rotate the optical unit (4) by means of motors about three mutually perpendicular directions (X, Y, Z) wherein one of said directions (Z) is perpendicular to the surface of the photocurable substance (3) facing the optical unit (4).

FIG. 4 shows the stereolithography apparatus (1) according to the first embodiment during a generation process in which the first driving means (10) has moved the detection means (8) out of a region to be actively exposed by the optical unit (4) but not out of the detection region (9). The arm (12) need not always to be moved out of the entire detection region (9). This is possible when the region to be actively exposed is smaller than the maximum region which can be exposed, and thus the projected image is not obstructed by the arm (12). But even when the detection means (8) is out of the actively exposed region, it may be used to detect at least stray radiation resulting from the image projected by the optical unit (4) into the actively exposed region and output a signal indicative of the detected stray radiation. The arm (12) may also be continually moved inside the detection region (9) such that it remains outside the actively exposed region and detect as much stray radiation as possible. It is also possible that the optical unit (4) projects in the generation pause towards the photocurable substance (3) only a relatively small image that will be entirely obstructed by the detection means (8) to prevent hardening of the photocurable substance (3) during detection. The detection means (8) detects at least part of this relatively small image and output a signal to the control unit (6) indicative of the optical properties of the optical unit (4). The control unit (6) adjusts the optical unit (4) to modify the image to be projected based on the outputted signal.

Figure 6:
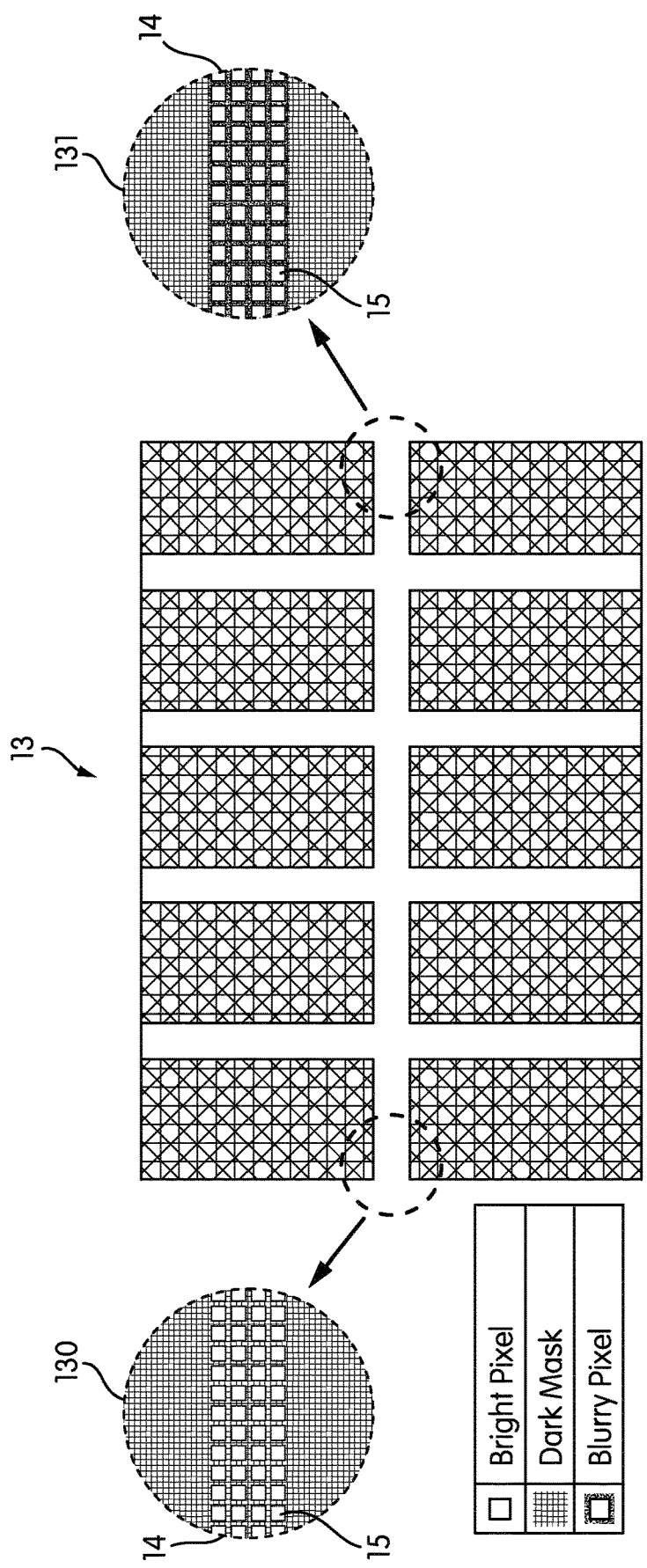
FIG. 6—is a schematic view of a calibration image used for adjusting the stereolithography apparatus and modifying the layered images according to an embodiment of the present invention.

FIG. 6 shows a calibration image (13) projected by the optical unit (4) projected towards the focus layer (5). The calibration image (13) has one or more rows (14) of alternating pixels (15) to be illuminated for allowing detection of intensity and sharpness of the projected calibration image (13). The left region (130) shows a sharp image in which the rows (14) of pixels (15) are bright and clearly separated from the dark mask. The right region (131) shows an unsharp image in which the rows (14) of pixels (15) are blurry and not clearly separated from the dark mask. In the right region (131), the pixel-based image cannot be clearly recognized. However, when looking at the entire calibration image (13) including the left and right regions (130,131) the imaging fault is indicative of a tilt as in FIG. 3. Thus, the calibration image (13) may include at least a left and a right region (130,131) of said pixels (15) aligned along the opposing ends of the focal layer (5) to allow detecting a tilt in the focus layer (5).

Figure 7:
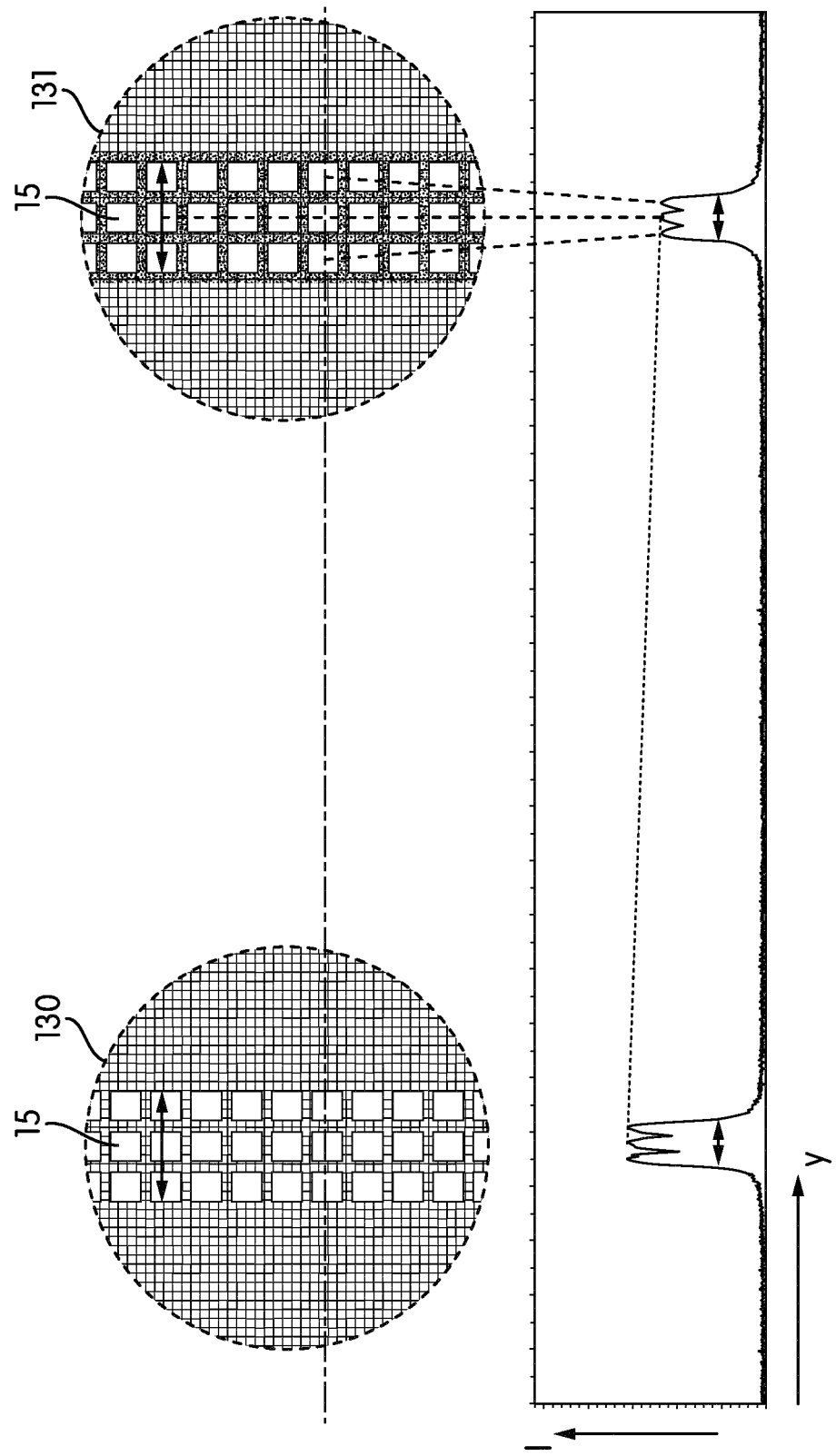
FIG. 7—is a schematic view of a detected intensity variation in the projected calibration image according to an embodiment of the present invention.

FIG. 7 shows an intensity profile (I) measured in the direction (Y) along the dashed line connecting the left and right regions (130,131) in the detected calibration image (13). The intensity profile (I) has two peaks each having local maxima and minima corresponding to bright/blurry pixels (15) in the left and right regions (130,131). The left and right regions (130,131) differ in sharpness which can be seen through the lower peak on the right sight. The local maxima and minima in the two peaks can be clearly seen and related in one-to-one correspondence to the pixels (15) in the rows (14) of the left and right regions (130,131). FIG. 7 shows a tilted image which has a certain degree of sharpness. It is clear from FIG. 7 that the sensors (8a-8f) need not essentially be necessary for imaging. The same intensity profile could also be obtained through photodiodes or the like and analyzed using mathematical methods to determine the size, sharpness and number of the pixels. As shown in FIG. 7, the widths of the two peaks have a proportionality to the widths of the corresponding pixels (15) in the left and right regions (130,131). Thereby, the local magnification can be determined. The dotted line connecting the two peaks demonstrates the change in the intensity (I). As shown in FIG. 7, the local maxima and minima in the right peak are smaller than those in the left peak which is due to the fault in sharpness in the calibration image (13) in the right region (131). Despite of the partially unsharp image, the change in the intensity as well as the transition between the dark mask and the bright/blurry pixels (15) can be observed. It is also possible to observe the inhomogeneous distribution of light which is related to the tilt in the focus layer (5).

Figure 8:
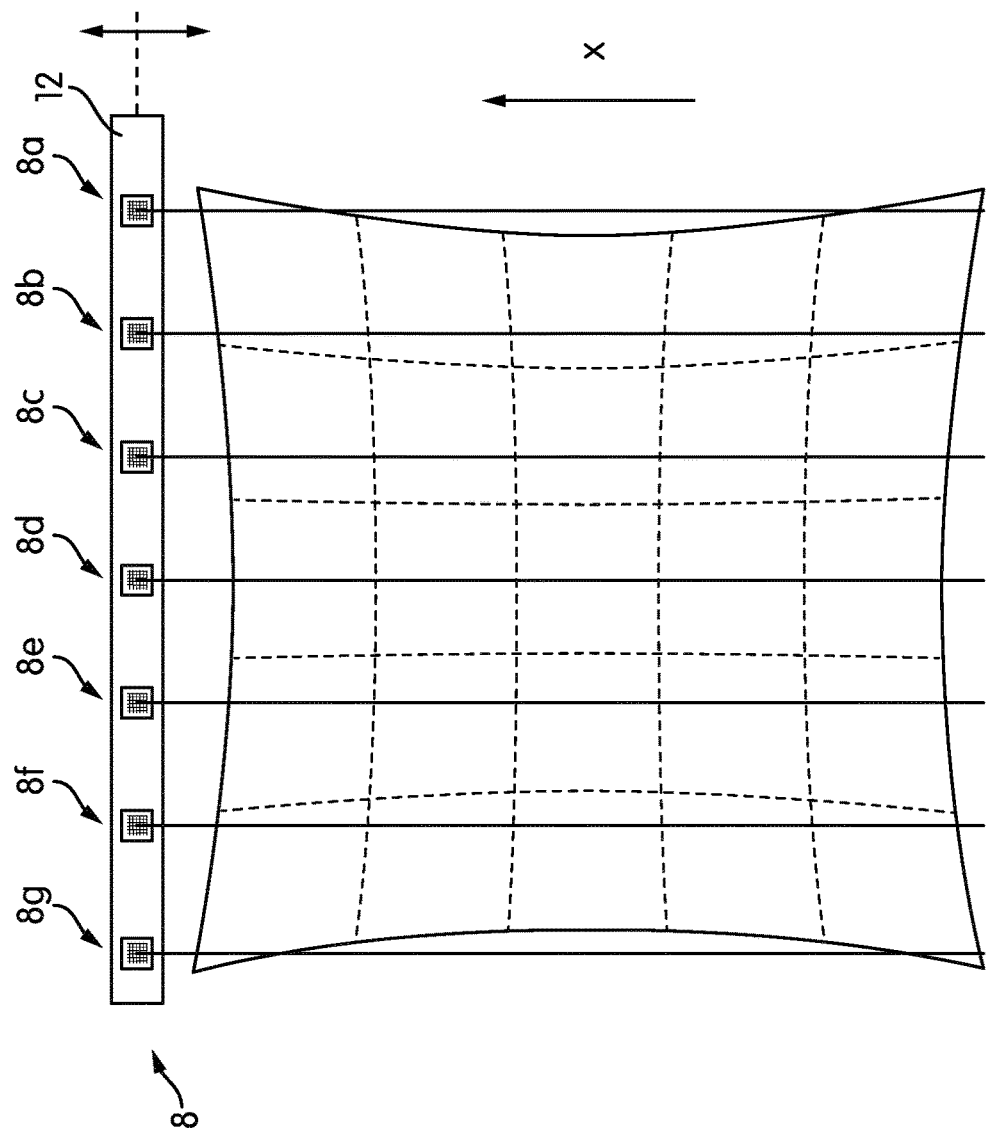
FIG. 8—is a schematic view of a distorted image detected by the detection unit of the stereolithography apparatus according to an embodiment of the present invention.

FIG. 8 shows how the projected image is scanned through the detection unit (7). The detection means (8) is moved stepwise or continually by the first driving means (10) within the detection region (9) across the entire projection field of the optical unit (4) along a direction (X) perpendicular to the optical axis (O). The detection means (8) outputs a signal indicative of the detected image during the scanning process. Thereby a compensation matrix is determined based on the distortion of the detected image or the change in the local magnification scales. Thereafter the control unit (6) changes the images to be projected based on this compensation matrix to compensate for the distortion.

The invention claimed is:

1. A stereolithography apparatus for generating a three-dimensional object from a photocurable substance, comprising:
an optical unit for projecting an image towards the photocurable substance for hardening the photocurable substance deposited in a focus layer;
a control unit for controlling the optical unit,
further comprising:
a detection unit which comprises: a detection means that is movably arranged in a detection region for detecting during a generation process or in a generation-pause at least part of the image projected by the optical unit and for outputting a signal indicative of the detected image to the control unit; and a first driving means for moving the detection means into or out of the detection region, and wherein
the optical unit further comprises: a second driving means which is linked to the optical unit for moving the focus layer into or out of the detection region, wherein
the control unit is further adapted to control the first driving means and the second driving means, and to adjust the optical unit and/or to modify the image to be projected based on the signal indicative of the detected image.

2. The stereolithography apparatus according to claim 1, wherein the first driving means is further adapted to move the detection means into or out of the detection region along a direction (X) perpendicular to an optical axis (O).

3. The stereolithography apparatus according to claim 1, wherein the second driving means is adapted to move the focus layer into or out of the detection region along the optical axis (O).

4. The stereolithography apparatus according to claim 1, wherein the detection unit is removable.

5. The stereolithography apparatus according to claim 1, wherein the detection means comprises one or more sensors.

6. The stereolithography apparatus according to claim 5, wherein the one or more sensors comprises an active sensor area and/or the one or more sensors is suitable for detecting a wavelength of an exposure by the optical unit.

7. The stereolithography apparatus according to claim 5, wherein the detection means comprises an arm for supporting the sensors in an array, wherein the first driving means is linked to the arm and further adapted to move the arm into or out of the detection region, wherein the arm is arranged to be parallel the surface of the photocurable substance that is facing the optical unit.

8. The stereolithography apparatus according to claim 1, wherein the second driving means is further adapted for independently rotating the optical unit about three mutually perpendicular directions (X,Y,Z) wherein one of said directions (Z) is perpendicular to the surface of the photocurable substance facing the optical unit, and the control unit is further adapted to adjust the optical unit to remove a tilting of the optical axis (O) by controlling the second driving means.

9. The stereolithography apparatus according to claim 1, wherein the first driving means is adapted to move the detection means out of a region to be actively exposed by the optical unit within the detection region, and the detection means is adapted to detect at least stray radiation resulting from the image projected by the optical unit into the actively exposed region and for outputting a signal indicative of the detected stray radiation.

10. The stereolithography apparatus according to claim 1, wherein the optical unit is adapted to project, during the generation process or in the generation pause, towards the photocurable substance another image that will be entirely obstructed by the detection means to prevent hardening of the photocurable substance during detection, and wherein the detection means is adapted to detect at least part of the another image and output the signal indicative of the another image to the control unit, and the control unit is further adapted to adjust the optical unit or to modify the another image to be projected based on the signal indicative of the another image.

11. The stereolithography apparatus according to claim 1, wherein the optical unit is adapted to project a calibration image towards the focus layer, wherein the calibration image comprises: one or more rows of alternating pixels to be illuminated for allowing detection of intensity and sharpness of the projected calibration image, and wherein the calibration image comprises at least a left and a right region of said pixels corresponding to the opposing ends of the focal layer to allow detecting a tilt in the focus layer.

12. The stereolithography apparatus according to claim 1, wherein the detection means is adapted to detect at least part of the image projected by the optical unit during the first driving means stepwise or continually moves the detection means along a direction (X) perpendicular to the optical axis (O) within the detection region, and for outputting the signal indicative of the detected image to the control unit; and the control unit is further adapted to determine a compensation matrix based on the detected image, and to change the image to be projected based on compensation matrix.

13. The stereolithography apparatus according to claim 1, wherein the control unit is further adapted to adjust the magnification scale, sharpness of the layer image, and position of the focus layer of the optical unit and compensate for the optical distortion based on the signal indicative of the detected image.

14. The stereolithography apparatus according to claim 1, wherein the optical unit comprises two or more sub optical units for independently projecting two or more images respectively towards the photocurable substance for hardening the photocurable substance deposited in the focus layers, wherein the detection means is adapted to detect during the generation process or in the generation-pause at least part of each of the two or more images projected by the sub optical units and to output the signal indicative of the detected images to the control unit, and wherein the second driving means comprises two second sub driving means each linked to the sub optical units for moving the focus layers into or out of the detection region, wherein the second sub driving means are mutually coupled to drive the focus layers into or out of the detection region simultaneously, wherein the control unit is further adapted to adjust the sub optical units and/or to modify the images to be projected based on the signal indicative of the detected images and to obtain the same imaging properties in the focus layers.

15. The stereolithography apparatus according to claim 14, wherein the control unit is further adapted to adjust the two or more sub optical units based on the signal outputted to project the respective images in the focal layers side-by-side without gaps and overlaps.

* * * * *